US006639794B2

(12) United States Patent
Olarig et al.

(10) Patent No.: US 6,639,794 B2
(45) Date of Patent: Oct. 28, 2003

(54) CHASSIS WITH ADAPTIVE FAN CONTROL

(75) Inventors: Sompong Paul Olarig, Pleasanton, CA (US); Donald Joseph Stoddard, San Jose, CA (US); Michael Hansen, Pleasanton, CA (US)

(73) Assignee: Maxxan Systems, Inc., San Jose, CA (US)

( * ) Notice: Subject to any disclaimer, the term of this patent is extended or adjusted under 35 U.S.C. 154(b) by 37 days.

(21) Appl. No.: 10/024,165

(22) Filed: Dec. 18, 2001

(65) Prior Publication Data

US 2003/0112600 A1 Jun. 19, 2003

(51) Int. Cl.[7] ................................................. H05K 7/20
(52) U.S. Cl. ...................... 361/687; 361/695; 361/719; 174/15.2; 62/259.2; 454/184
(58) Field of Search .................. 361/687, 685, 361/726, 690, 692–695, 717–719, 700; 174/15.2; 62/259.2; 454/184; 415/213.1, 214.1

(56) References Cited

U.S. PATENT DOCUMENTS

| 5,544,012 | A | * | 8/1996 | Koike | 361/695 |
| 5,562,410 | A | * | 10/1996 | Sachs et al. | 361/695 |
| 5,680,294 | A | * | 10/1997 | Stora et al. | 361/695 |
| 6,072,397 | A | * | 6/2000 | Ostrowski | 340/588 |
| 6,370,603 | B1 | * | 4/2002 | Silverman et al. | 710/72 |

* cited by examiner

*Primary Examiner*—Darren Schuberg
*Assistant Examiner*—Hung Van Duong
(74) *Attorney, Agent, or Firm*—Trop, Pruner & Hu, P.C.

(57) ABSTRACT

A chassis with an adaptive fan control is provided for electronic equipment. The adaptive fan control is responsive to at least one condition within one or more airflow sections within the chassis and may increase or decrease airflow in response to the condition.

24 Claims, 4 Drawing Sheets

CHASSIS WITH ADAPTIVE FAN CONTROL

FIELD OF THE INVENTION

This invention relates generally to an electronic chassis for free-standing rack mounted use that enable cooling of electronic components housed inside the chassis.

BACKGROUND

Computer and storage networks have become highly prevalent as the need to share expensive computing assets such as storage devices has increased. Today, large local area network ("LAN") systems and storage area networks ("SAN") are commonplace in many businesses.

As can be appreciated, businesses that use networks such as SANs are highly dependent upon these systems for round-the-clock availability. Therefore, manufacturers of such systems need to take great care in addressing issues relating to reliability. One of those issues is thermal management of the heat developed in LAN and SAN equipment. Large LAN and SAN networks often have a chassis for each subsystem of the network that is capable of supporting a large number of plug-in cards to accommodate the maximum design capacity of the system. Therefore, cooling systems designed to provide appropriate thermal management for the electronics within those chassis must be able to handle the worst-case thermal load. However, quite often a company may not utilize the full capacity of a particular subsystem and therefore that subsystem may not be fully populated with plug-in cards. As such, the thermal load for that particular subsystem may be substantially less than the maximum thermal load the cooling system for that subsystem is designed to accommodate.

In subsystems that support a large number of plug-in cards but are only partially populated with plug-in cards, the fans or blowers may still be running as if all of the plug-in cards were present. As a result, the cooling capacity may be greater than necessary. This excess capacity results in unnecessary power consumption, increased acoustical noise level, and may reduce the expected service life of the associated fans or blowers.

Therefore, what is needed is an apparatus and method that provides sufficient cooling for subsystem that may be responsive to actual subsystem conditions.

BRIEF DESCRIPTION OF THE DRAWINGS

The invention may best be understood by referring to the following descriptions and accompanying drawings that are used to illustrate embodiments of the invention. In the drawings.

DETAILED DESCRIPTION

Figure 1:
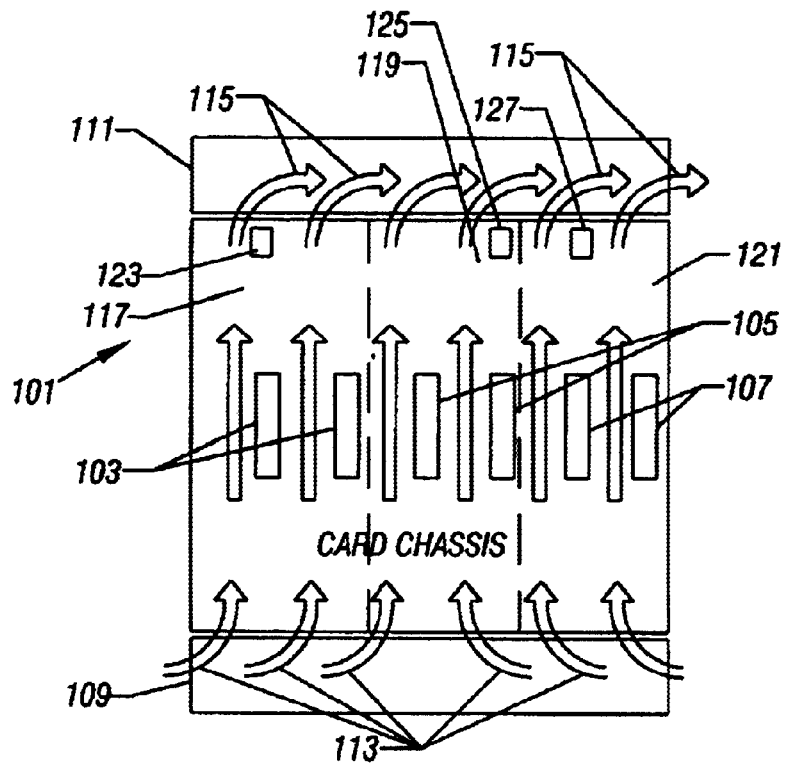
FIG. 1 illustrates a chassis having multiple air flow sections according to some embodiments of the present invention.

In the following description, numerous specific details are set forth to provide a detail on the patent invention. However, one skilled in the art will readily appreciate that the present invention may be practiced without these specific details. The specific details are provided by way of example and not by way of limitation.

In the drawings, like or similar elements are designated with identical reference numerals throughout the several views. Also, the various elements depicted are not necessarily drawn to scale.

Referring to FIG. 1, a card chassis 101 includes a plurality of plug-in card slots 103, 105 and 107. These card slots may be designed to accept plug-in cards for a SAN, LAN, computer or other electronic device.

The card chassis 101 also may include an air intake section 109 and an air exhaust section 111. In some embodiments, air enters the air intake section 109 as illustrated by arrows 113 and exits through the exhaust section 111 as illustrated by arrows 115. The airflow through the card chassis 101 may be divided into a plurality of sections such as sections 117, 119 and 121. These sections 117, 119 and 121, in some embodiments, may be separated from each other by airflow dividers that may include partitions attached to the card chassis 101.

In other embodiments, airflow dividers may be provided by plug-ins cards that may be plugged into one or more of the card slots 103, 105 and 107. In still other embodiments, airflow sections 117, 119 and 121 may not be physically divided by airflow dividers. However, where dedicated airflow dividers may not be provided, airflow within the airflow sections 117, 119 and 121 may be designed such that airflow within a particular airflow section may generally flow within that section.

Within one or more of the air flow sections 115, 119 and 121, sensors such as sensors 123, 125, and 127 may be associated with one or more air flow sections 117, 119 and 121 to detect certain parameters within those air flow sections. In some embodiments, the sensors 123, 125 and 127 may be airflow sensors. In other embodiments, the sensors 123, 125 and 127 may be temperature sensors. In still other embodiments, the sensors 123, 125 and 127 may be slot sensors that may detect when a card is plugged into, or removed from, one or more of the card slots 103, 105 and 107. The sensors 123, 125 and 127, in some embodiments, may be coupled to a fan controller (not shown) to control fans (not shown) that may be associated with airflow sections 117, 119 and 121. In some embodiments, the fan controller may utilize signals from the sensors 123, 125 and 127, to control airflow from a plurality of fans that may be associated with one or more of the airflow sections 117, 119 and 121.

Figure 2:
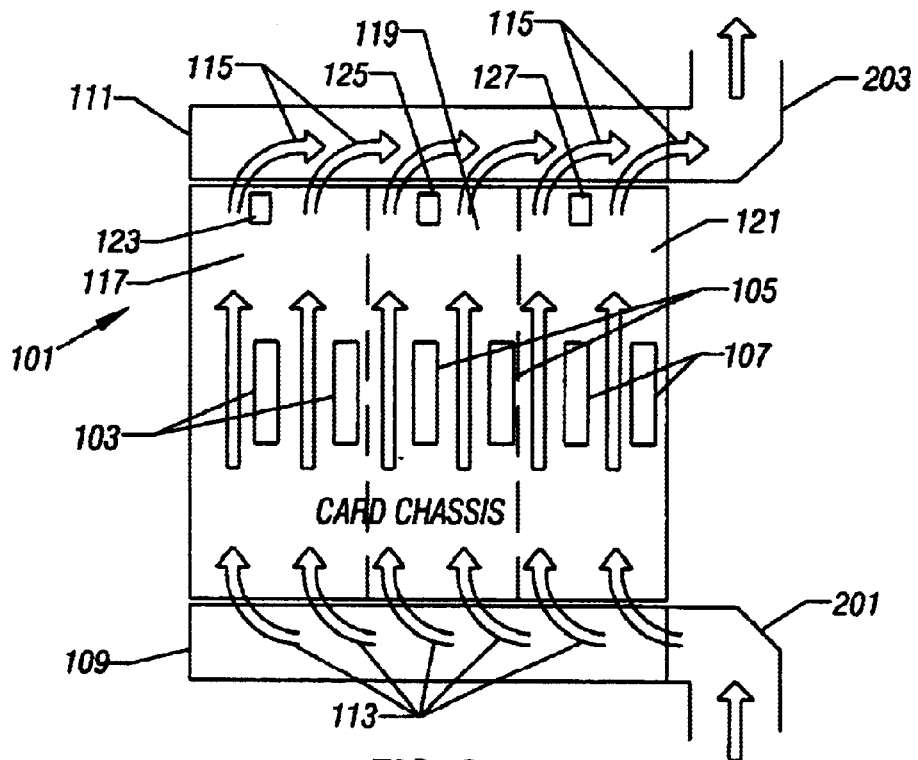
FIG. 2 illustrates a chassis having a plurality of cooling sections and ducted air passages according to some embodiments of the present invention.

In other embodiments, as illustrated in FIG. 2, the air intake section 109 may be provided with an air intake duct 201. This duct 201 may serve to channel airflow into the air intake section 109. An airflow outlet duct 203, in some embodiments, may be provided to control the output airflow from exhaust section 111.

Figure 3:
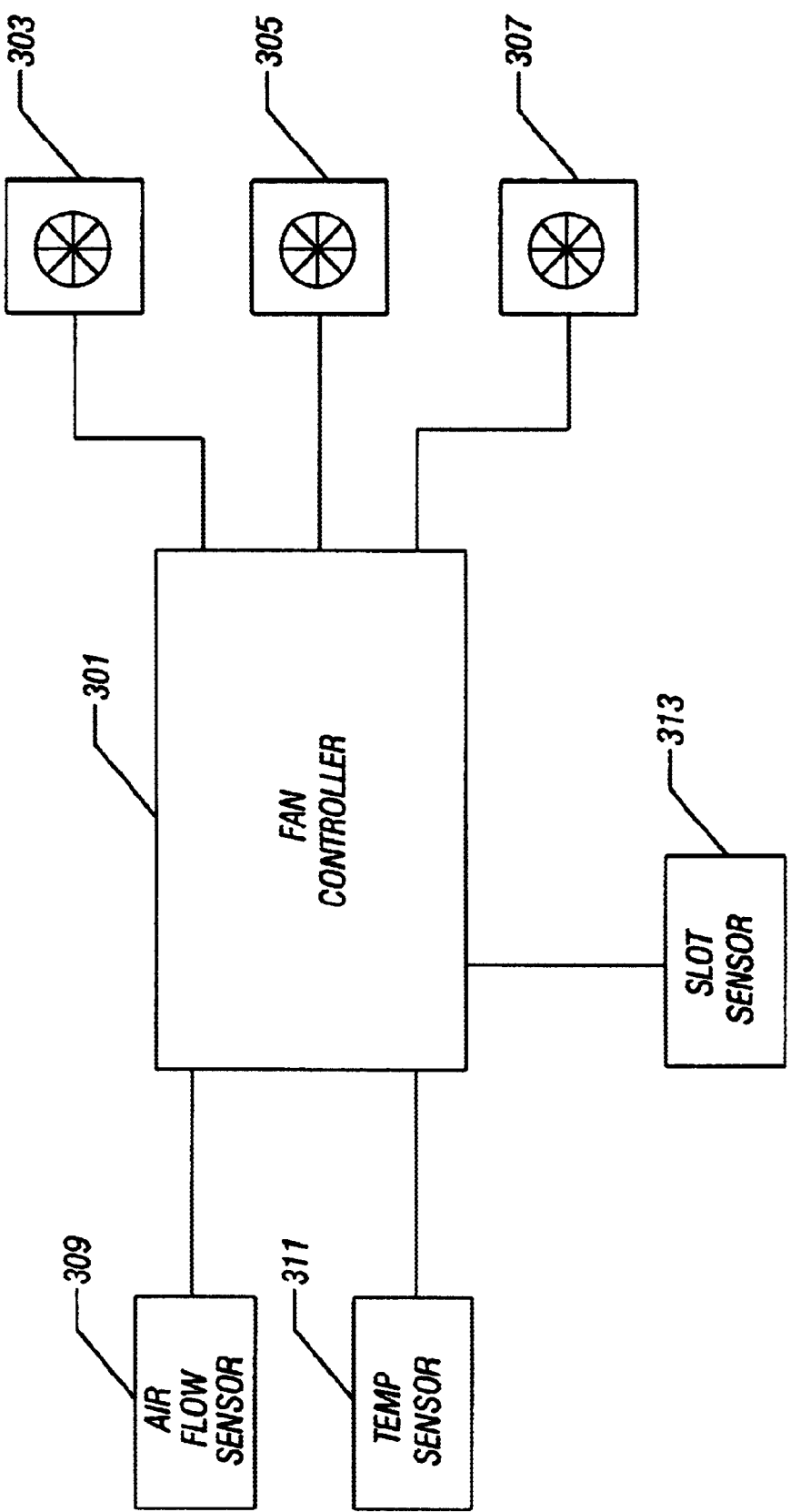
FIG. 3 illustrates a fan control system according to some embodiments of the present invention.

Referring now to FIG. 3, a fan controller 301 may be connected to a plurality of fans or blowers 303, 305 and 307. The fan controller 301 may also be connected to one or more sensors that may include one or more air flow sensors 309 in some embodiments. In other embodiments, one or more temperature sensors 311 may be connected to the fan controller 301. In still other embodiments, one or more slot sensors 313 may be connected to the fan controller 301. The fan controller 301, in some embodiments, may also receive a signal from one or more of a plurality of fans 303, 305 and 307 that may indicate one or more operating parameters of one or more of the plurality of fans 303, 305 and 307. As one example, the fan controller may receive a signal from a fan that may indicate the speed the fan may be operating at. Often a reduced fan speed is an indication of a fan failure or partial failure.

In one embodiment, the fans 303, 305 and 307 may be associated with airflow sections 117, 119 and 121, respectively. The fan controller 301 may control the fans 303, 305 and 307 to maintain air flow within the air flow sections 117, 119 and 121 to be within certain preset parameters. For example, a fan controller may use a sensor such as temperature sensor 311 which may be associated with airflow section 117 to control the fan 303. In this example, the fan controller 301 may utilize the temperature sensor 311 to control the airflow from fan 303 or one or more of the other fans 305 and 307.

In other embodiments, the fan controller 301 may utilize slot sensors 313 to control one or more of the fans 303, 305 and 307. The slot sensors 313, in some embodiments, may detect when a plug-in card is plugged into individual plug-in slots or pairs or plug-in slots such as card slots 103, 105 and 107. The fan controller 301 may use one or more signals from the slot sensors 313 to control the airflow from the plurality of fans 303, 305 and 307 to control airflow within one or more of the air flow sections 117, 119 and 121.

In this example, the fans may operate in response to one or more plug-in cards being installed within a particular airflow section such as 117, 119 and 121. In some embodiments, if one or more plug-in cards are installed in the plug-in slots 103, the fan controller 301 may turn on or increase the air flow within air flow section 117 by controlling the air flow from one or more of a plurality of fans 303, 305 and 307. One or more of the fans 303, 305 and 307 may be associated with a particular air flow section such that if one or more plug-in cards are plugged into a card slot within an air flow section, one or more fans associated with the air flow section may be controlled by the fan controller 301 in response thereto.

A fan controller 301, in some embodiments, may also detect when airflow within a particular airflow section may be safely decreased. For example, a fan controller 301 may detect that one or more plug-in cards from an air flow section has been removed, the fan controller may then shut down or decrease the output from one or more fans that may be associated with that particular air flow section. The fan controller 301 may also utilize a sensor to detect when a fan has failed or has reduced output. In response of a failed fan or a fan with a reduced output, the fan controller 301 may adjust the speed of the slowing fan or one or more other fans to compensate for a reduced airflow in an airflow section associated with the failed fan or fan with reduced output.

By using the fan controller 301, the operational configuration of the plurality of fans may be dynamically changed depending on changing parameters within the chassis 101. In this manner, fan power may be utilized in response to changing needs within one or more airflow sections within the plug-in card chassis 101 which may provide for reduced power requirements, reduced noise level, and increased system reliability.

Of course, the fan controller 301 at the same time may utilize multiple different kinds of sensors. For example, the fan controller 301 may receive signals from airflow sensors, temperature sensors, slot sensors, fan sensors and other sensors to control airflow within one or more air flow sections within the chassis 101.

The fan controller 301, in some embodiments may utilize a microprocessor to control the fans and receive signals from one or more sensors. In other embodiments, the fan controller 310 may be a state machine designed to perform the functions of the fan controller 301.

Figure 4:
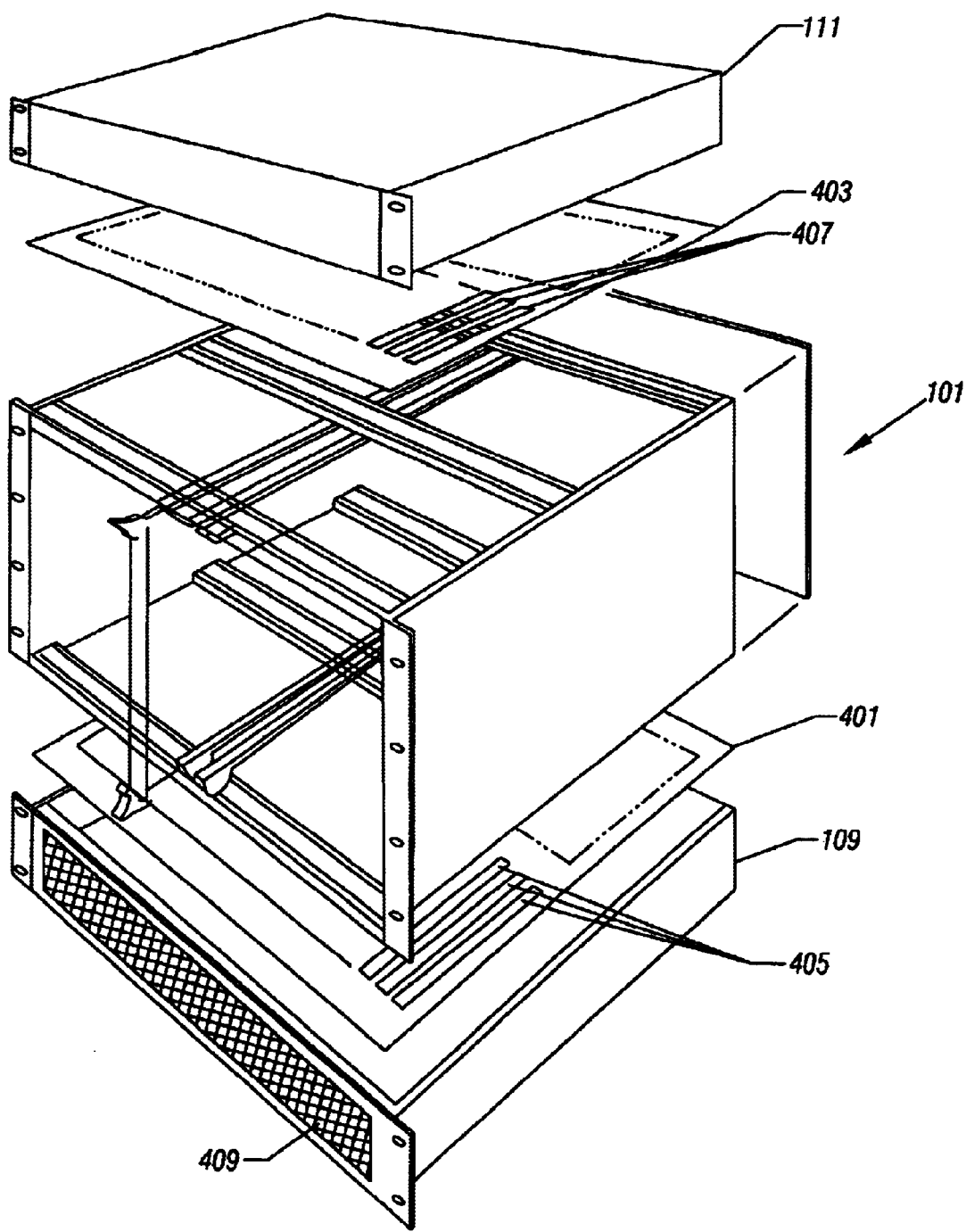
FIG. 4 is an expanded isometric illustration of a chassis according to some embodiments of the present invention.

Referring now to FIG. 4, in some embodiments, one or more airflow baffles such as baffles 401 and 403 may be provided to control airflow through the card slot chassis 101. These airflow baffles 401 and 403 may have air flow slots 405 and 407, respectively. These airflow slots may serve to control, at least in part, airflow through the airflow sections 117, 119, and 121 (shown in FIG. 1) within the card slot chassis 101.

Air intake section 109 may also include an air filter 409 which may serve to filter contaminants out of the airflow. Air intake section 109, in some embodiments, may contain a plurality of fans (not shown), some of which may be associated with one or more air flow sections within the card slot chassis 101. In other embodiments, the exhaust section 111 may contain a plurality of fans, some of which may be associated with one or more of the air flow sections within a card slot chassis 101. In still other embodiments, fans may be utilized in both the air intake section 109 and in the exhaust section 111.

Figure 5:
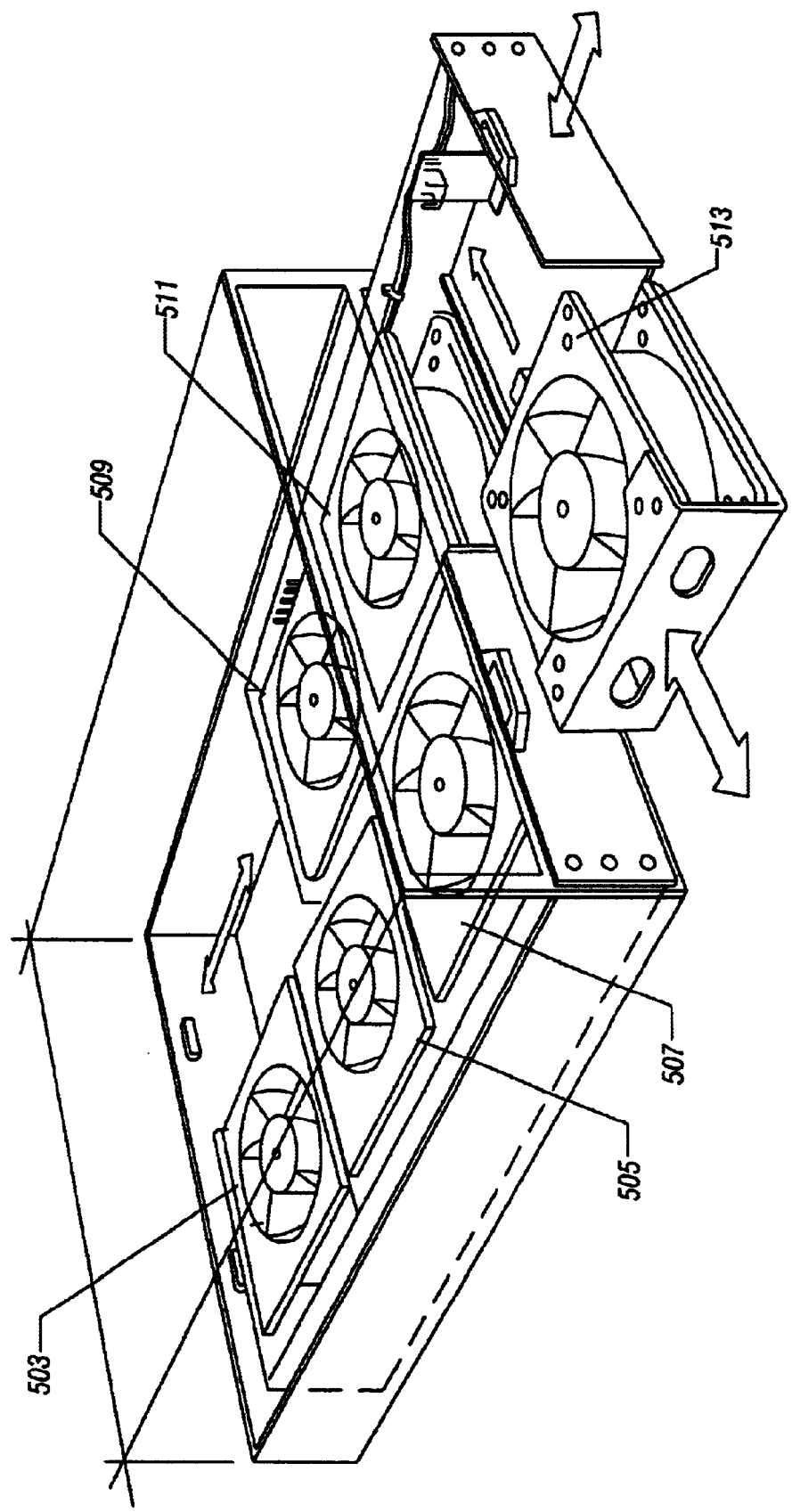
FIG. 5 illustrates a multiple fan tray according to some embodiments of the present invention.

Referring now to FIG. 5, a fan section 501 includes a plurality of fans 501–513. Fan section 501, in some embodiments, may be an air input section such as section 109 or an exhaust section such as section 111. In other embodiments, fan section 501 may be utilized for both the air input sections 109 and the exhaust section 111.

Fans 503–513 may be coupled to fan controller 301 as described in association with FIG. 3. One or more of the fans 503–513 may be associated with one or more airflow sections, such as sections 117, 119 and 121. For example, in some embodiments, fans 503 and 509 may be associated with airflow section 117. Fans 505 and 511 may be associated with airflow section 119 and fans 507 and 511 may be associated with airflow section 121.

As discussed above, in some embodiments, if one or more plug-in cards are inserted into card slots 103, fans 503 and 509 may be controlled by fan controller 301 to increase airflow through airflow section 117. In like manner, in some embodiments, fans 505 and 509 and fans 507 and 511 may be associated with airflow sections 119 and 121, respectively.

While two fans may be associated with a particular airflow section, more or less fans may be utilized. However, by utilizing a plurality of fans for a particular airflow section, redundancy is available should a particular fan fail. Also, if a fan has a reduced output, the controller 301 may increase the airflow in an adjacent airflow section that may increase the airflow within the airflow section associated with the reduced output fan. In some embodiments, the controller 301 may increase the, speed of the slowing fan.

In some embodiments, the fans 503–513 may be hot pluggable fans. Hot pluggable fans may be fans that may be installed and removed without having to remove power from all of the fans in a particular fan tray, such as tray 501.

While the present invention has been described with respect to a limited number of embodiments, those skilled in the art will appreciate numerous modifications and variations therefrom. For example, while fans have been illustrated, other airflow circulators may be utilized. It is intended that the appended claims cover all such modifications and variations as fall within the true spirit and scope of this present invention.

What is claimed is:

1. An apparatus comprising:
   a chassis for housing electronic components including plug-in card slots, the chassis having an intake section and an exhaust section;
   a plurality of airflow sections including a first and a second adjacent airflow section positioned generally between the intake and exhaust sections;
   an a plurality of air circulators, each primarily associated with one of the plurality of airflow sections and coupled to the chassis operative to flow air through the plurality of airflow sections;
   a sensor coupled to the plurality of air circulators; and
   wherein the airflow in the first airflow section is changed in response to an operational parameter of an airflow circulator primarily associated with the second adjacent airflow section.

2. An apparatus as in claim 1 wherein three airflow sections are located, in part, between the intake and exhaust sections.

3. An apparatus as in claim 1 wherein the air circulator includes multiple airflow circulators operative to flow air within predetermined airflow sections.

4. An apparatus as in claim 1 wherein the sensor is responsive to temperature within one or more airflow sections.

5. An apparatus as in claim 1 wherein the sensor is responsive to airflow within one or more airflow sections.

6. An apparatus as in claim 1 wherein the sensor is responsive to the operational speed of one or more airflow circulators.

7. An apparatus as in claim 1 wherein the sensor is responsive to plug-in cards being located within one or more airflow sections.

8. An apparatus as in claim 1 wherein the airflow circulators include a hot pluggable fan.

9. An apparatus as in claim 1 wherein a baffle for directing airflow is coupled between the intake section and exhaust section.

10. An apparatus as in claim 1 wherein a computer network card is coupled to a plug-in card slot and coupled to a network of at least one computer.

11. An apparatus as in claim 1 wherein a storage network card is coupled to a plug-in card slot and coupled a network of at least one data storage device.

12. An apparatus as in claim 1 wherein the at least one air circulator is coupled to the intake section of the chassis and at least one air circulator is coupled to the exhaust section of the chassis.

13. An apparatus as in claim 3 wherein the multiple airflow circulators operate in pairs to flow air within predetermined airflow sections.

14. An apparatus as in claim 7 wherein the sensor is operative to increase airflow within an airflow section in response to a plug-in card being present within the airflow section.

15. An apparatus as in claim 12 wherein at least one air circulator coupled to the intake section pushes air into at least one airflow section and at least one air circulator coupled to the exhaust section pulls air, in part, from at least one airflow section.

16. An apparatus as in claim 12 wherein at least one air circulator coupled to the intake section pulls air, in part, from at least one airflow section and at least one air circulator coupled to the exhaust section pushes into at least one airflow section.

17. An apparatus as in claim 13 wherein six airflow circulators operate in pairs to flow air primarily through three airflow sections.

18. An apparatus as in claim 14 wherein the sensor is operative to decrease airflow within an airflow section in response to a plug-in card being absent within the airflow section.

19. A method comprising:
   fabricating a chassis for housing electronic components having a plurality of airflow sections including a first and second adjacent airflow section and a plurality of airflow circulators wherein each circulator is primarily associated with one of the airflow sections;
   monitoring a condition within an the first adjacent airflow section; and
   changing the airflow in the second adjacent airflow section in response to a condition within the first adjacent airflow section.

20. A method as in claim 19 further comprising fabricating the chassis with three airflow sections.

21. A method as in claim 20 further comprising monitoring a condition in each of the airflow sections.

22. A method as in claim 21 further comprising monitoring the presence of a plug-in card.

23. A method as in claim 22 further comprising changing the airflow within a particular airflow section in response to the presence of a plug-in card.

24. A method as in claim 22 further comprising changing the airflow within a particular airflow section in response to the removal of a plug-in card.

* * * * *